US007636057B2

(12) United States Patent
Patterson et al.

(10) Patent No.: US 7,636,057 B2
(45) Date of Patent: Dec. 22, 2009

(54) FAST, EFFICIENT REFERENCE NETWORKS FOR PROVIDING LOW-IMPEDANCE REFERENCE SIGNALS TO SIGNAL CONVERTER SYSTEMS

(75) Inventors: Gregory W. Patterson, Jamestown, NC (US); Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 35 days.

(21) Appl. No.: 12/151,104

(22) Filed: May 2, 2008

(65) Prior Publication Data
US 2009/0273502 A1 Nov. 5, 2009

(51) Int. Cl.
*H03M 1/34* (2006.01)
(52) U.S. Cl. .................................. 341/158; 327/108
(58) Field of Classification Search .............. 341/158, 341/172, 161; 327/538, 540, 108; 324/541; 323/316, 313
See application file for complete search history.

(56) References Cited

U.S. PATENT DOCUMENTS

| | | | | |
|---|---|---|---|---|
| 5,023,472 | A * | 6/1991 | Hashimoto et al. | 327/108 |
| 5,646,515 | A | 7/1997 | Mayes | 323/313 |
| 6,118,266 | A | 9/2000 | Manohar | 323/316 |
| 6,249,240 | B1 | 6/2001 | Bellaouar | 341/172 |
| 6,313,692 | B1 | 11/2001 | Pease | 327/538 |
| 6,417,725 | B1 | 7/2002 | Aram et al. | 327/541 |
| 6,486,820 | B1 | 11/2002 | Allworth et al. | 341/161 |
| 6,909,391 | B2 | 6/2005 | Rossi | 341/161 |
| 7,023,181 | B2 | 4/2006 | Nakata | 322/28 |
| 7,026,824 | B2 | 4/2006 | Chen | 324/541 |
| 7,098,735 | B2 | 8/2006 | Ranganathan | 330/252 |
| 7,215,182 | B2 | 5/2007 | Ali | 327/538 |

OTHER PUBLICATIONS

King, Craig, "Differential ADC Biasing Techniques", Microchip Technology, Application Note AN842, Jun. 2002, pp. 1-4.
Miller, Perry, "The Design and Performance of a Precision Voltage Reference Circuit . . . ", Analog Applications Journal, May, 2000, pp. 1-4.
Maxim Application Note 994, "Reference Voltage for Multiple ADCs", Maxim Integrated Products, Sunnyvale, California, Mar. 6, 2002, 5 pages.

* cited by examiner

*Primary Examiner*—Rexford N Barnie
*Assistant Examiner*—Joseph Lauture
(74) *Attorney, Agent, or Firm*—Koppel, Patrick, Heybl & Dawson

(57) ABSTRACT

Reference network embodiments are provided for use in pipelined signal converter systems. The network embodiments are fast and power efficient and they generate low-impedance reference signals through the use of a complimentary common-drain output stage, an output current valve inserted between transistors of the output stage, and a controller. The controller is configured to provide gate voltages to the output current valve to thereby establish a substantially-constant output current. The controller is further configured to provide gate voltages to the output stage to establish top and bottom reference voltages about the output current valve that are spaced from a common-mode voltage. This reference structure maintains a constant output current as the span between the top and bottom reference voltages is selectively altered. In different embodiments, transistors of the output current valve are arranged in a drain-to-source-coupled configuration and in a source-coupled configuration.

20 Claims, 5 Drawing Sheets

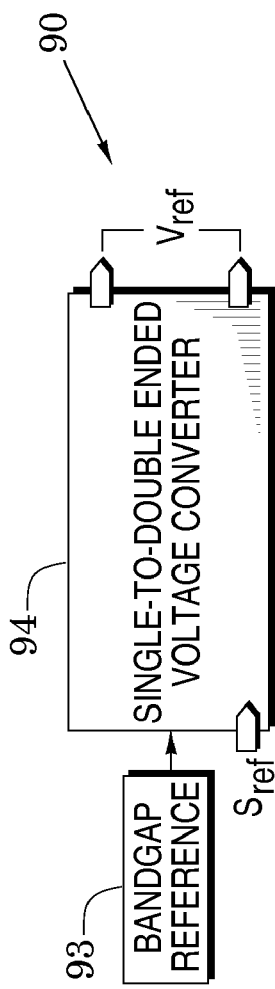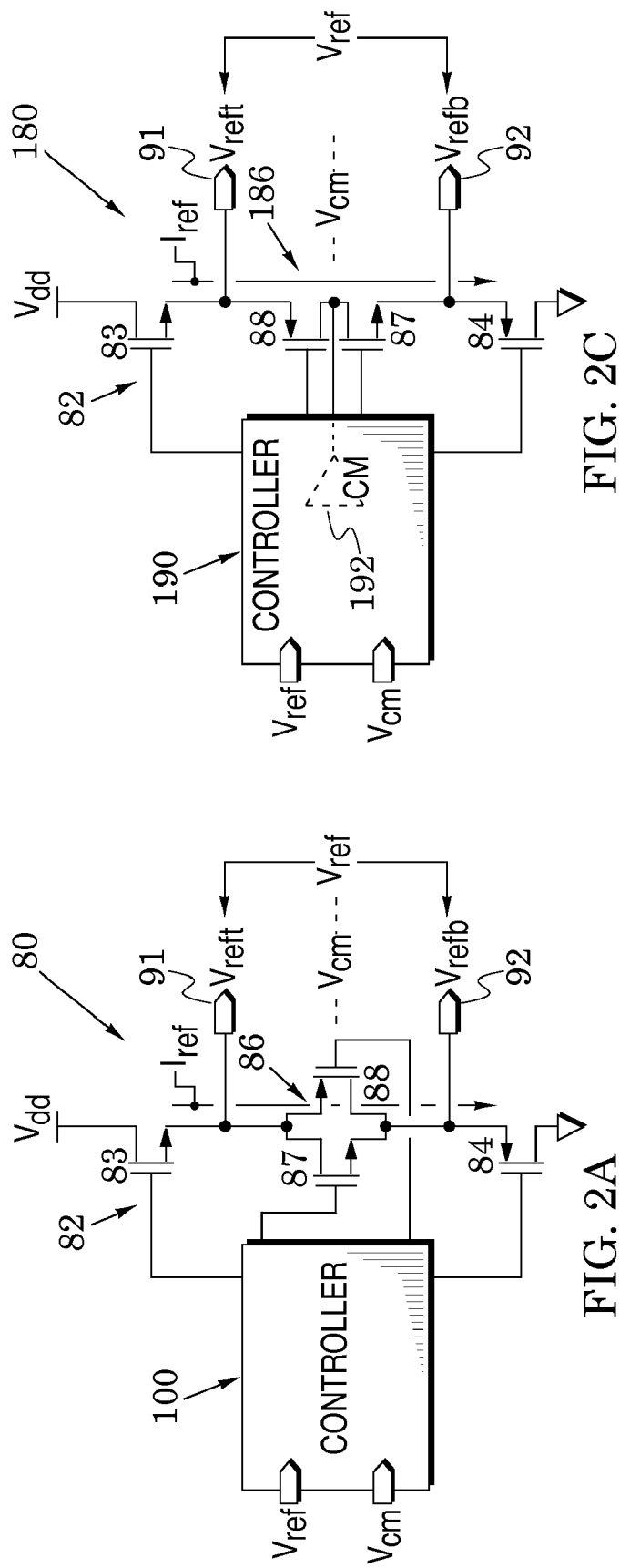
FIG. 2B
FIG. 2C
FIG. 2A

FAST, EFFICIENT REFERENCE NETWORKS FOR PROVIDING LOW-IMPEDANCE REFERENCE SIGNALS TO SIGNAL CONVERTER SYSTEMS

BACKGROUND OF THE INVENTION

1. Field of the invention

The present invention relates generally to signal converters.

2. Description of the Related Art

Pipelined analog-to-digital converter systems are capable of achieving impressive resolution and signal-to-noise performance at extremely high sample rates (e.g., 150 megasamples per second). Accordingly, they are useful in a wide range of demanding converter applications (e.g., charge-coupled device imaging, ultrasonic medical imaging, base station processing, digital receivers, digital video, cable modems, digital subscriber line systems, and Ethernet systems).

The speed of a pipelined system is realized by processing an analog input signal through a series of converter stages. Each stage provides a respective digital code and, except for the last stage, each also forms an analog residue signal which is passed to a succeeding stage for further conversion. The respective digital code is typically used to apply a selected one of a set of reference signals to switched-capacitor circuits to thereby generate the residue signal. Because the accuracy of the residue signal is directly related to parameters (e.g., speed, accuracy and impedance) of the reference signals, the generation of these signals is critical to the performance of the converter system.

BRIEF SUMMARY OF THE INVENTION

The present disclosure is generally directed to fast, efficient structures and methods for generation of low-impedance reference signals which may be effectively used in analog-to-digital converter systems. The drawings and the following description provide an enabling disclosure and the appended claims particularly point out and distinctly claim disclosed subject matter and equivalents thereof.

BRIEF DESCRIPTION OF THE DRAWINGS

FIG. 2A illustrates a reference network embodiment for use in the system of FIG. 1;

FIG. 2B illustrates a structure for reducing temperature, process and supply variations in the network of FIG. 2A;

FIG. 2C illustrates another reference network embodiment for use in the system of FIG. 1;

DETAILED DESCRIPTION OF THE INVENTION

FIGS. 1-5 are directed to converter systems and reference network embodiments for use in these systems. The network embodiments are fast and power efficient and they generate low-impedance reference signals through the use of a complimentary common-drain output stage, an output current valve inserted between transistors of the output stage, and a controller. The controller is configured to provide gate voltages to the output current valve to thereby establish a substantially-constant output current. The controller is further configured to provide gate voltages to the output stage to establish top and bottom reference voltages about the output current valve that are spaced from a common-mode voltage.

This reference structure maintains a constant output current as the span between the top and bottom reference voltages is selectively altered. In different embodiments, transistors of the output current valve are arranged in a drain-to-source-coupled configuration and in a drain-coupled configuration.

Figure 1:
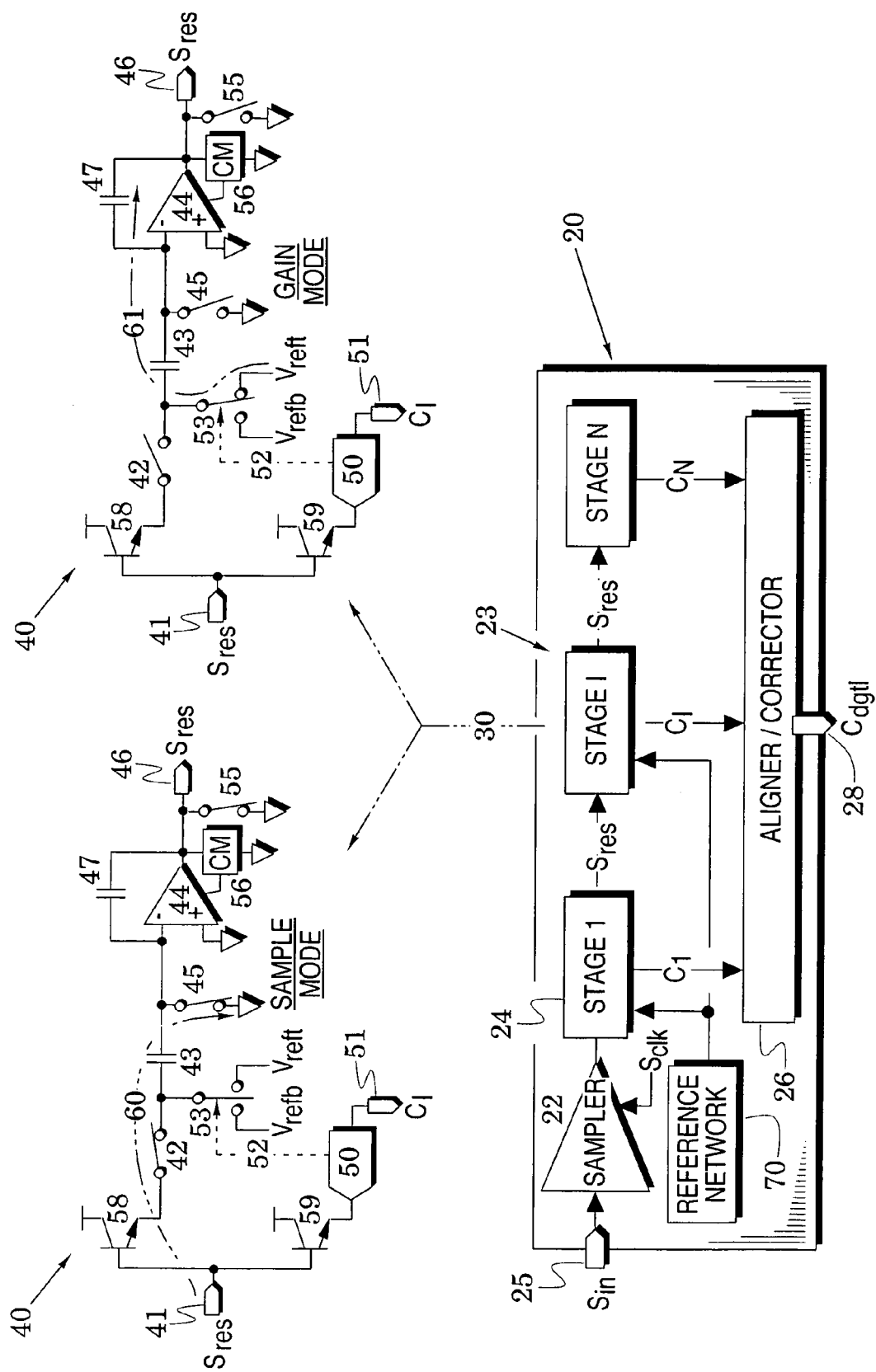
FIG. 1 includes a block diagram of a pipelined analog-to-digital converter system and schematics that illustrate operational modes in an exemplary converter stage of the system.

In particular, FIG. 1 illustrates an analog-to-digital converter system 20 that includes a sampler 22 which precedes a string 23 of N pipelined converter stages 24. In response to clock signals $S_{clk}$, the sampler provides, to the string 23, successive samples of an analog input signal $S_{in}$ that is received at a system input port 25. In response to each of the samples, the first of the converter stages provides a respective digital code $C_1$ and also generates a residue signal $S_{res}$ which is passed to the succeeding converter stage. Except for the Nth converter state, each succeeding converter stage processes a residue signal from the preceding converter stage into a respective digital code and a respective residue signal which is again passed to a succeeding converter stage. The last of the converter stages 24 processes a residue signal from the preceding converter stage into a respective digital code $C_N$.

Because the stages' digital codes that correspond to each sample are generated on successive clock signals, they must be temporally aligned in an aligner/corrector 26 which is also generally configured to use redundancy in the digital codes of the converter stages to correct conversion errors. From the temporally-aligned and corrected codes, the aligner/corrector 26 provides digital codes $C_{dgtl}$ at a system output port 28 that each corresponds to a respective one of the samples from the sampler 22. Before examining an exemplary stage embodiment, it is noted that, in other system embodiments, the sampler 22 may be removed with its sampling function realized within the initial converter stage.

Example arrow 30 directs attention to a switched-capacitor embodiment 40 of an $I_{th}$ one of the converter stages. For exemplary purposes, the embodiment 40 is shown as a 1.5 bit converter stage. In this 1.5 bit embodiment, a first sample switch 42 and a sample capacitor 43 are serially arranged between a converter input port 41 and the input of an amplifier 44. A second sample switch 45 is coupled to the input of the amplifier and the amplifier's output feeds a converter residue port 46 wherein a second capacitor 47 is coupled about the amplifier.

The input port 41 is also coupled to an ADC 50 which feeds a converter code port 51 and also provides a control signal 52 to control a reference switch 53 that couples to a junction between the first sample switch 42 and the sample capacitor 43. In response to the control signal 52, the reference switch 53 selects one of top and bottom reference voltages $V_{reft}$ and $V_{refb}$. Finally, an output switch 55 is coupled to the output of the amplifier 44 and a common-mode (CM) controller 56 provides common-mode control signals to the amplifier in response to the amplifier's output signals. In other stage embodiments, the first sample switch 42 and the ADC 50 may be preceded by the isolation of buffer transistors 58 and 59. As shown in the converter system 20, the reference signals are provided to all but the last of the stages 24 by a reference network 70. It is noted that the portion of the converter stage embodiment 40 that generates the residue signal $S_{res}$ is often referred to as a multiplying digital-to-analog converter (MDAC).

During each system clock cycle, the switched-capacitor converter stage 40 operates in two successive operational modes to process a residue signal at the input port 41 that lies somewhere in an input window $V_{ref}$. Accordingly, FIG. 1 shows the stage in an initial sample mode and also in a succeeding gain mode. In the sample mode, the first and second sample switches 42 and 45 are closed so that the residue signal $S_{res}$ at the input port 41 injects electrical charges along a charge path 60 into the sample capacitor 43. In the sample mode, the second sample switch 45 shorts the input of the amplifier 44 and the output switch 55 shorts the amplifier's output.

In the succeeding gain mode, the ADC 50 provides the $I_{th}$ digital code $C_1$ and, based on this decision, also sets the control signal 52 so that the reference switch 53 selectively couples a selected one of top and bottom reference voltages $V_{reft}$ and $V_{refb}$ to the sample capacitor 45 to thereby transfer electrical charges along a transfer path 61 from the sample capacitor 43 into the output capacitor 47. This charge transfer generates the residue signal $S_{res}$ at the output port 46 for subsequent processing by the succeeding one of the converter stages 24.

The selection of the reference voltage is based on the digital code decision of the ADC 44 and is made so that the selected reference voltage directs the conversion of succeeding converter stages to the portion of the system's transfer function occupied by the analog input signal $S_{in}$. In addition to directing succeeding conversion to a proper portion of the system's transfer function, the selected reference signal also causes the output residue signal to be "gained up" so that the full selection window $V_{ref}$ is again presented for processing by the succeeding converter stage.

In an important observation of the present invention, it is noted that any error in the value of the reference signals $V_{reft}$ and $V_{refb}$ will induce a corresponding error in the residue signal $S_{res}$ that is presented for further processing by succeeding converter stages and this error thus directly corrupts the final digital code $C_{dgtl}$ presented at the system output port 28. In addition, it is noted that the transfer of electrical charges along the transfer path 61 occurs at the system's sample rate.

Accordingly, an improved reference network must have the speed (i.e., bandwidth) sufficient to accurately maintain the reference voltages while providing source and sink currents to converter stages at a rate significantly greater than the system sample rate. To facilitate these high-rate currents, an improved reference system should present these reference voltages with a low output impedance that can accurately drive charges along the transfer path 61.

To further enhance the accuracy of converter systems, the reference voltages should be substantially independent of temperature, process and supply variations. Because a substantial number of converter systems feature selective variation of the span $V_{ref}$ between the reference voltages $V_{reft}$ and $V_{refb}$, an improved reference network should also facilitate this selection. Finally, an improved reference network should be energy efficient in order to enhance the overall efficiency of converter systems.

These varied features are provided by the reference network embodiment 80 of FIG. 2A which includes a complimentary common-drain output stage 82, an output current valve 86, and a controller 100. The complimentary common-drain output stage is formed with top and bottom output transistors 83 and 84 and the output current valve 86 is formed with drain-to-source-coupled first and second valve transistors 87 and 88.

The output current valve 86 is inserted between the output transistors 83 and 84 so that transistors 83 and 88 form, in effect, a complimentary common source common-drain stage that drives a top output port 91 and transistors 87 and 84 form, in effect, another complimentary common-drain stage that drives a bottom output port 92. Because these stages are formed with source followers, they are inherently fast, low impedance sources for provision of output signals.

In addition, the first and second valve transistors 87 and 88 are thus arranged to receive gate signals from the controller 100 to thereby establish a substantially-constant output current $I_{ref}$ through the output current valve 86. The top and bottom output transistors 83 and 84 are also arranged to receive gate signals from the controller to thereby establish top and bottom reference voltages $V_{reft}$ and $V_{refb}$ about the output current valve 86 that are equally spaced from a common-mode voltage $V_{cm}$. In an embodiment, the controller adjusts the gate voltage of one of the output transistors 83 and 84 to selectively space apart the top and bottom reference voltages and adjusts the gate voltage of the other of the output transistors to center the reference voltages on a common-mode voltage.

In a significant feature, the span $V_{ref}$ between the reference voltages $V_{reft}$ and $V_{refb}$ can be selectively altered by the controller 100 while the output current $I_{ref}$ remains substantially constant. Thus, the output current $I_{ref}$ can be set to a desirably low value which then remains unchanged as $V_{ref}$ is moved over a predetermined range. This constant output current $I_{ref}$ substantially enhances the overall efficiency of a converter system that includes the reference network 80.

In order to stabilize the reference voltages $V_{reft}$ and $V_{refb}$, the reference voltage $V_{ref}$ is preferably provided to the controller 100 by a source such as the source 90 of FIG. 2B which includes a bandgap reference 91 and a single-to-double ended voltage converter 94. The bandgap reference provides a bandgap voltage (e.g., on the order of 1.25 volts) that is substantially independent of temperature, process and supply variations.

The converter 94 converts this bandgap voltage to double-ended voltages that are spaced by a reference voltage $V_{ref}$ which can be selected by a selection signal $S_{ref}$. A desired common-mode level can be established by providing a common-mode voltage $V_{ref}$ to the controller 100 from a suitable source (e.g., a fixed voltage source or a buffered voltage divider operating from a supply rail). In addition, therefore, to a substantially-constant output current $I_{ref}$, the reference network 80 provides reference voltages $V_{reft}$ and $V_{refb}$ that are selectable and substantially independent of temperature, process and supply variations.

Figure 3:
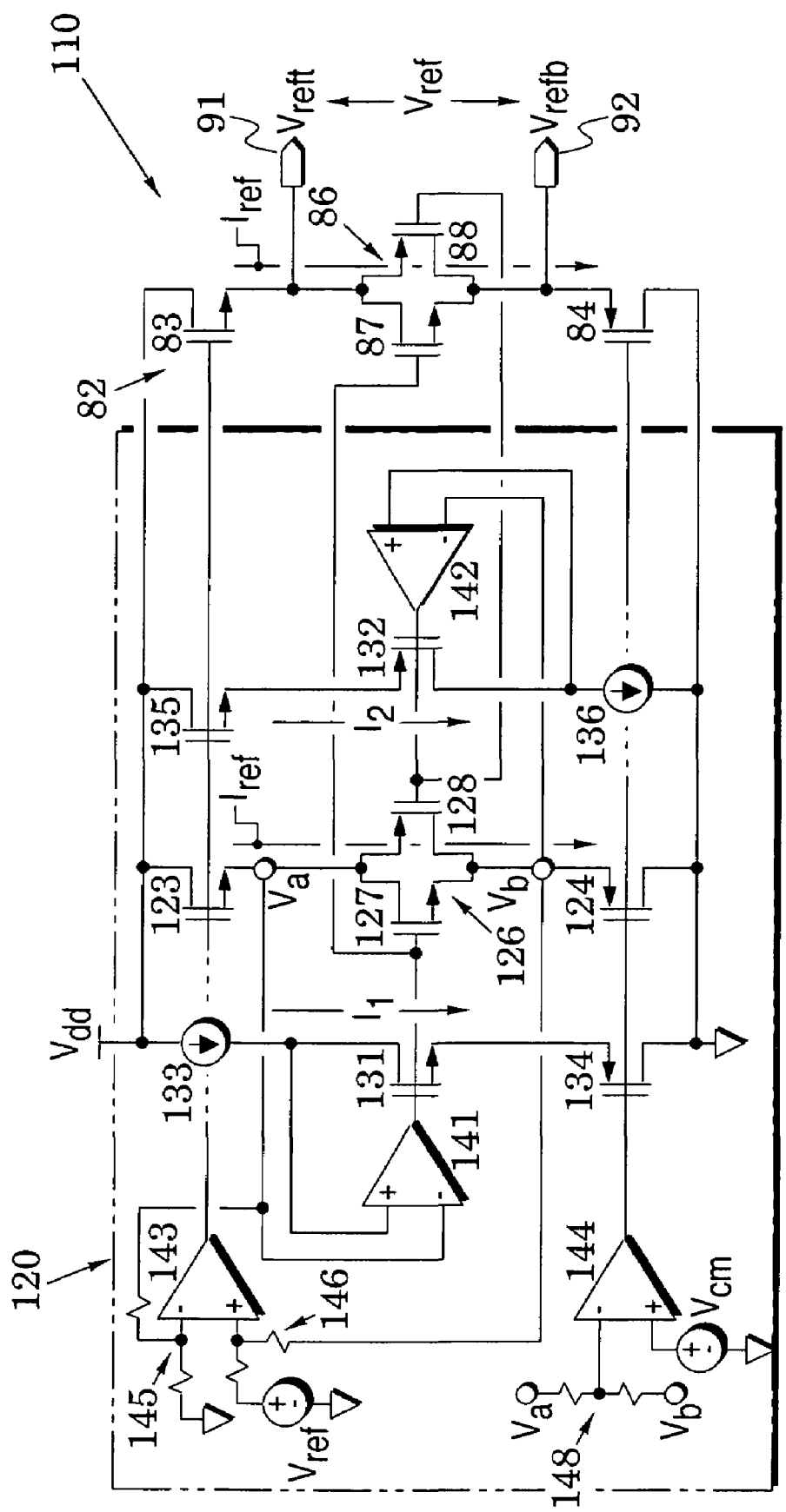
FIGS. 3 and 4 illustrate embodiments of the network of FIG. 2A.

FIG. 3 illustrates a reference network 110 that includes the complimentary common-drain output stage 82 and the output current valve 86 of FIG. 2A wherein the controller 100 is realized as a controller embodiment 120. The controller 120 includes first and second replica transistors 123 and 124 and a replica current valve 126 that is inserted between these replica transistors. The replica current valve 126 is formed with drain-to-source-coupled third and fourth valve transistors 127 and 128 and is gate-coupled to the output current valve 86.

The controller 120 also includes first and second current transistors 131 and 132 wherein the first current transistor 131 is inserted between a first current source 133 and a lower transistor 134 and the second current transistor 132 is inserted between an upper transistor 135 and a second current source 136. The first and second current transistors 131 and 132 are respectively gate-coupled to the third and fourth valve transistors 127 and 128. The first current source 133 urges a first current $I_1$ through the first current transistor 131 and the lower transistor 134 while the second current source 136 urges a second current $I_2$ through the second current transistor 132 and the upper transistor 135.

The controller 120 further includes a first differential amplifier 141 that is arranged to drive the gates of the first current transistor 131 and the third valve transistor 127 to reduce a voltage difference between the drain of the first current transistor and an upper side of the replica current valve 126. In addition, a second differential amplifier 142 is arranged to drive the gates of the second current transistor 132 and the fourth valve transistor 128 to reduce a voltage difference between the drain of the second current transistor and the bottom side of the replica current valve 126.

Finally, the controller 120 includes third and fourth differential amplifiers 143 and 144. The third differential amplifier 143 is arranged to drive the gates of the first replica transistor 123, the upper transistor 135 and the first output transistor 83 to thereby reduce the difference between the output of a voltage divider 145 that is coupled to the upper side of the replica current valve 126 and the output of a voltage divider 146 that is coupled between the lower side of the replica current valve 126 and a selectable reference voltage $V_{ref}$.

The fourth differential amplifier 144 is arranged to drive the gates of the lower transistor 134, the second replica transistor 124 and the bottom output transistor 84 to thereby reduce the difference between the output of a voltage divider 148 and a selectable common-mode voltage $V_{cm}$ wherein the voltage divider 148 is coupled between node voltages $V_a$ and $V_b$ at the upper and lower sides of the replica current valve 126.

The following operational description is directed to a network embodiment in which the first replica transistor 123, upper transistor 135, and top output transistor 83 operate with common current densities, the lower transistor 134, second replica transistor 124, and bottom output transistor 84 operate with common current densities, the first current transistor 131, third valve transistor 127 and first valve transistor 87 operate with common current densities, and the fourth valve transistor 128, second current transistor 132 and second valve transistor 88 operate with common current densities. That is, each group comprised of gate-coupled, same-polarity transistors operates with common current densities. In addition, the voltage dividers 145, 146 and 148 are each formed with equal resistor values.

In operation of the reference network 110, the differential amplifier 143 drives the gate of the first replica transistor 123 to substantially equalize the voltages at the differential amplifier's differential input and thus cause the node voltages at nodes $V_a$ and $V_b$ across the replica current valve 127 to substantially differ by $V_{ref}$. In a similar manner, the differential amplifier 144 drives the gate of the second replica transistor 124 to substantially equalize the voltages at the differential amplifier's differential input and thus cause the voltages at nodes $V_a$ and $V_b$ to be equally spaced from $V_{cm}$.

In further operation of the network, the differential amplifier 141 drives the gates of the first current transistor 131 and the third valve transistor 127 so that the voltages at both of their drains are substantially equal to the top node voltage $V_a$. In a similar manner, the differential amplifier 142 drives the gates of the second current transistor 132 and the fourth valve transistor 128 so that the voltages at both of their drains are substantially equal to the bottom node voltage $V_b$.

Thus, amplifiers 143 and 144 are part of control loops that drive the gates of the top and bottom replica transistors 123 and 124 and the first and second current transistors 135 and 136 so that the top and bottom nodes $V_a$ and $V_b$ are spaced apart by $V_{ref}$ and are equally spaced about $V_{cm}$. At the same time, amplifiers 141 and 142 are part of control loops that drive the gates of the first and second current transistors 131 an 132 and the third and fourth valve transistors 127 and 128 so that the latter transistors carry the sum $I_{ref}$ of first and second currents $I_1$ and $I_2$.

As noted above, the first and second replica transistors 123 and 124 are gate-coupled to the first and second output transistors 83 and 84, and the third and fourth valve transistors 127 and 128 are gate-coupled to the first and second valve transistors 87 and 88. As also noted above, gate-coupled, same-polarity transistors operate with common current densities. Accordingly, the output current valve 86 carries the output current $I_{ref}$ and voltages at the top and bottom output ports 91 and 92 are spaced apart by $V_{ref}$ and are equally spaced about $V_{cm}$.

Thus, the reference voltage $V_{ref}$ can be selectively varied (e.g., by control of the single-to-double ended voltage converter 90 of FIG. 2B) over a predetermined range and the output current $I_{ref}$ will remain substantially constant (as the sum of the first and second currents $I_1$ and $I_2$). As long as current densities are maintained, the first and second output transistors 83 and 84 and first and second valve transistors 87 and 88 can be sized (e.g., gate widths adjusted) to set a desired output current $I_{ref}$ and the sizes of all other transistors can be significantly reduced so that the network and system current drains are also significantly reduced. The current through the replica current valve 126 will therefore be a reduced version of the output current $I_{ref}$ in the output current valve 86 which further enhances network and system efficiency.

The structure of FIG. 2B also insures that the reference voltage $V_{ref}$ and the output current $I_{ref}$ are substantially independent of independent of temperature, process and supply variations. In addition, the source follower arrangement of the top output transistor 83 and the second valve transistor 88 and the source follower arrangement of the bottom output transistor 84 and the first valve transistor 87 provides fast, low-impedance drive structures at the top and bottom output ports 91 and 92. This output structure is especially suited to maintain the reference voltages while sinking and sourcing rapid load currents (as required, for example, in the switched-capacitor stage structures shown in FIG. 1). These characteristics can substantially enhance the accuracy of the signal conversion of a pipelined converter system.

Figure 4:
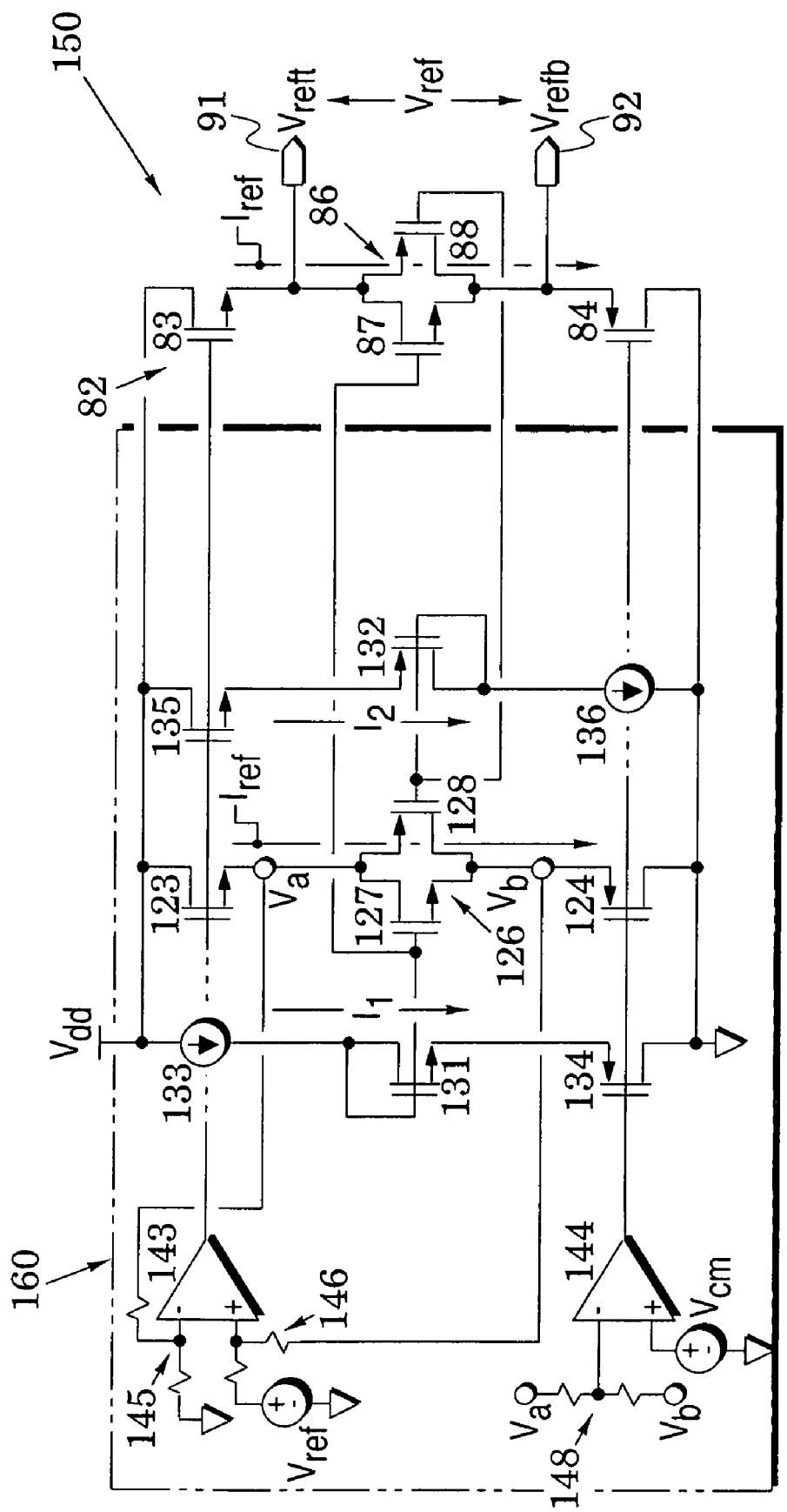

FIG. 4 illustrates another reference network embodiment 150 which is similar to the network 110 of FIG. 3 with like elements indicated by like reference numbers. In contrast, however, the controller 120 of the network 110 is altered to a controller 160 in which the differential amplifiers 141 and 142 of the network 110 are eliminated and circuit paths are added so that the first and second replica transistors 131 and 132 are diode coupled. Although the matching in the network 150 between the drain voltages of the first and second current transistors 131 and 132 and drain voltages of the third and fourth valve transistors 127 and 128 is somewhat degraded (so that the current $I_{ref}$ differs somewhat from the sum of currents $I_1$ and $I_2$), this network is substantially simpler than that of FIG. 3.

Figure 5:
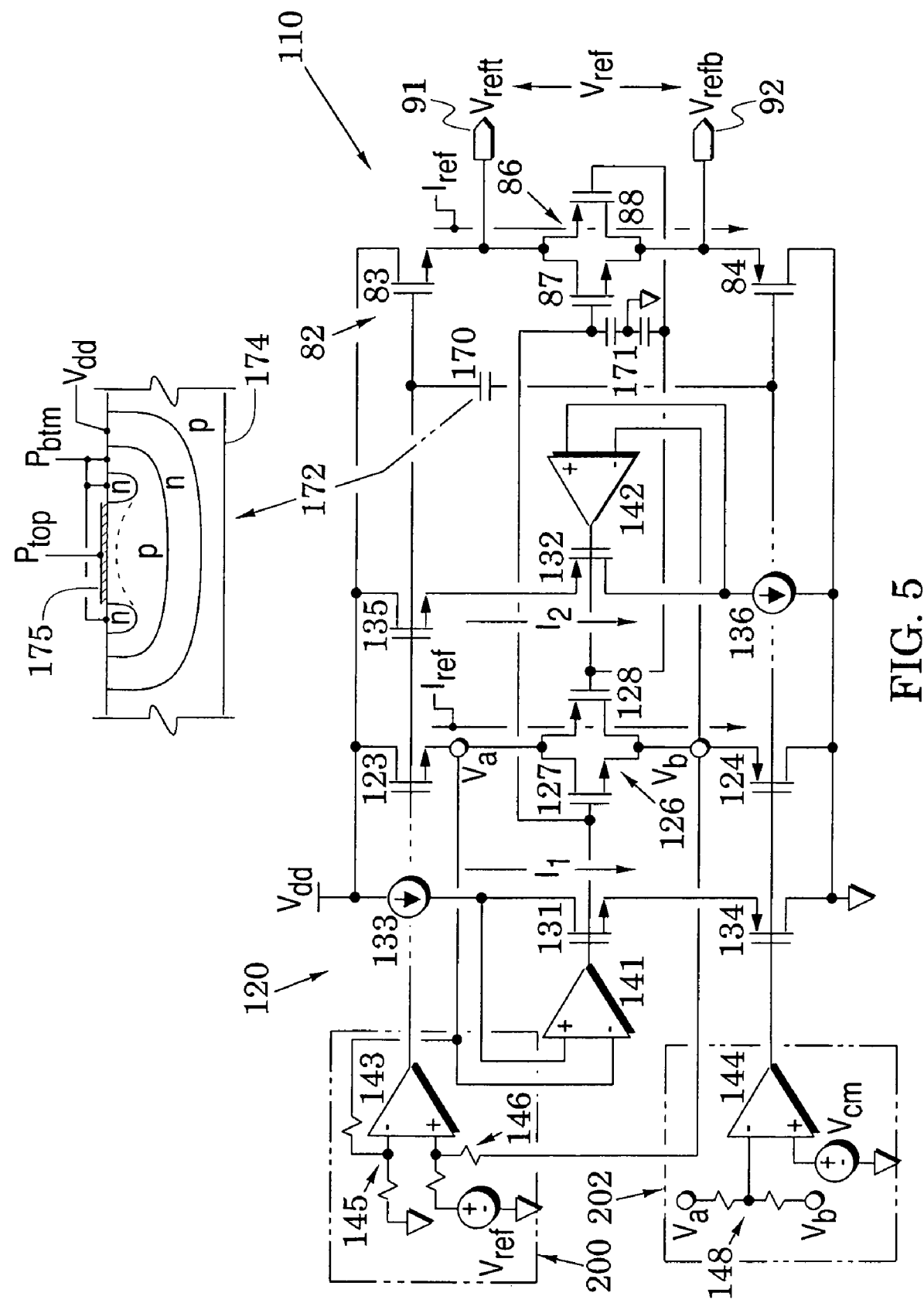
FIG. 5 shows the network of FIG. 3 with added capacitors that reduce noise in the network's reference voltages.

The reference network 110 of FIG. 3 is shown again in FIG. 5 with capacitors added to reduce noise that would otherwise appear in the top and bottom reference voltages $V_{reft}$ and $V_{refb}$. In particular, a capacitor 170 is coupled across the gates of the first and second output transistors 83 and 84 and a pair 171 of capacitors couples the gates of the output current valve 86 to ground to thereby substantially inhibit the flow of noise signals between the controller 120 and the output ports 91 and 92. In another network embodiment, the pair 171 can be replaced by a single capacitor coupled between the gates of the output current valve 86.

In an exemplary realization of the network 110 of FIG. 5, the supply $V_{dd}$ could be set to 1.8 volts (suitable for a 0.18 micron CMOS fabrication process) and gate widths of the first and second output transistors 83 and 84 and the first and second output valve transistors 87 and 88 set to be four times the gate width of transistors in the controller 120 to thereby enhance efficiency. The span $V_{ref}$ reference between the reference voltages $V_{reft}$ and $V_{refb}$ can be selectively set by varying the gate voltages of the top and bottom output transistors 83 and 84. For example, this span can be selected over a range between 0.7 and 1.1 volts by spreading the gate voltages of the first and second output transistors out to 2.15 and −0.35 volts. In this exemplary realization, the lower terminal of the capacitor 170 would be negative with respect to an integrated-circuit substrate in which the network is realized.

Example arrow 172 in FIG. 5 points to an integrated-circuit structure which would be suitable for realizing the capacitor 170 and facilitating a negative voltage at its lower terminal. In this structure, a deep n-well is realized in a p-type substrate and a p-well is realized in the deep n-well. A transistor is then structured in the p-well with a gate 175 formed with a poly-silicon gate layer over a silicon dioxide layer that extends between source and drain n-type pockets which define the extent of an inverted channel (indicated by a broken line) beneath the gate.

The gate in this capacitor structure forms a top plate $P_{top}$ of the capacitor 170 and the source and drain n-type pockets are coupled to the p-well to form the bottom plate $P_{btm}$. The deep n-well is preferably tied to a positive voltage such as $V_{dd}$. With this capacitor structure, the junctions on each side of the n-well are safely reverse biased when the bottom plate of the capacitor 170 is taken negative.

FIG. 2C illustrates another reference network 180 which is similar to the network 80 of FIG. 2A with like elements indicated by like reference numbers. In contrast to the network 80, however, the first and second valve transistors 87 and 88 are now arranged in a drain-coupled configuration 186 (rather than a drain-to-source-coupled configuration).

Similar to the output current valve 86, the output current valve 186 is inserted between the output transistors 83 and 84 so that transistors 83 and 88 form, in effect, a complimentary common-drain stage that drives the top output port 91 and transistors 87 and 84 form, in effect, another complimentary common-drain stage that drives the bottom output port 92. Because these stages are formed with source followers, they are inherently fast, low impedance sources for provision of the reference voltages.

A controller 190 in FIG. 2C is similar to the controller 90 and is arranged to provide gate signals to the valve transistors 87 and 88 to thereby establish a substantially-constant output current $I_{ref}$ through the output current valve 186. The controller 190 also provides gate signals to the top and bottom output transistors 83 and 87 to thereby establish top and bottom reference voltages $V_{reft}$ and $V_{refb}$ about the output current valve 86 that are equally spaced from a common-mode voltage $V_{cm}$. Because the drain-coupled node between the first and second valve transistors 87 and 88 is a high impedance node, the controller 190 preferably includes a low impedance common-mode (CM) buffer 192 that drives this node to thereby maintain its common-mode level.

An embodiment of the controller 190 can also include a replica current valve that is formed with the third and fourth valve transistors 127 and 128 of FIG. 3 but these valve transistors are rearranged in a drain-coupled configuration that mimics that of the output current valve 186. This embodiment can further include control loops to drive the gates of the top and bottom replica transistors 123 and 124 and the first and second current transistors 135 and 136 (see FIG. 3) so that the top and bottom nodes $V_a$ and $V_b$ in FIG. 2C are spaced apart by $V_{ref}$ and are equally spaced about $V_{cm}$. At the same time, amplifiers 141 and 142 are part of control loops that drive the gates of the first and second current transistors 131 and 132 and the third and fourth valve transistors 127 and 128 (see FIG. 3) so that the latter transistors carry the sum $I_{ref}$ of first and second currents $I_1$ and $I_2$ as do also the first and second valve transistors 87 and 88 of FIG. 2C.

In FIG. 3, the third differential amplifier 143 and its associated elements were described as a control loop that drives the gates of the first replica transistor 123, the upper transistor 135 and the top output transistor 83. These loop elements are shown to be part of a general control loop 200 in FIG. 5 to emphasize that they form only an exemplary one of many possible embodiments of this loop.

Also with reference to FIG. 3, the fourth differential amplifier 144 and its associated elements were described as a control loop that drives the gates of the lower transistor 134, the second replica transistor 124 and the bottom output transistor 84. These loop elements are shown to be part of a general control loop 202 in FIG. 5 to emphasize that they also form only an exemplary one of many possible embodiments of this loop.

Although the current sources 133 and 136 of FIGS. 3 and 4 may be set to provide equal currents in one network embodiment, it is noted that the amplitudes of these currents may differ in other network embodiments. It is further noted that the voltage dividers 145 and 146 of the network 150 will draw slight currents from the top and bottom node voltages $V_a$ and $V_b$. In another network embodiment, current sources may be added to the network to supply these slight currents. This modification allows the replica current valve 126 to mimic the currents and voltages of the output current valve 86 with even greater fidelity so that the correspondence between the reference voltages $V_{reft}$ and $V_{refb}$ at the output ports 91 and 92 and the node voltages $V_a$ and $V_b$ is further enhanced.

The embodiments of the invention described herein are exemplary and numerous modifications, variations and rearrangements may achieve substantially equivalent results and are intended to be embraced in the appended claims.

We claim:

1. A reference network to provide reference voltages, comprising:
   a complimentary common-drain output stage formed with top and bottom output transistors;
   an output current valve of first and second valve transistors inserted between said output transistors; and
   a controller that provides gate voltages to said first and second valve transistors to establish a substantially-constant output current trough said output current valve and provides gate voltages to said top and bottom output transistors to establish top and bottom reference voltages about said output current valve that are spaced from a common-mode voltage.

2. The network of claim 1, wherein said first and second valve transistors are arranged in a drain-to-source-coupled configuration.

3. A reference network to provide reference voltages, comprising:
   a complimentary common-drain output stage formed with top and bottom output transistors;
   an output current valve of first and second valve transistors inserted between said output transistors; and a controller that provides gate voltages to said first and second valve transistors to establish a substantially-constant output current through said output current valve and provides gate voltages to said top and bottom output transistors to establish top and bottom reference voltages about said output current valve that are spaced from a common-mode voltage;

wherein said first and second valve transistors are arranged in a drain-to-source-coupled configuration; and wherein said controller is configured to:

adjust the gate voltage of one of said top and bottom output transistors to selectively space apart said top and bottom reference voltages; and adjust the gate voltage of the other of said top and bottom output transistors to center said top and bottom reference voltages on said common-mode voltage.

4. A reference network to provide reference voltages, comprising:

a complimentary common-drain output stage formed with top and bottom output transistors;

an output current valve of first and second valve transistors inserted between said output transistors; and a controller that provides gate voltages to said first and second valve transistors to establish a substantially-constant output current through said output current valve and provides gate voltages to said top and bottom output transistors to establish top and bottom reference voltages about said output current valve that are spaced from a common-mode voltage;

wherein said first and second valve transistors are arranged in a drain-to-source-coupled configuration; and wherein said controller includes a replica current valve gate-coupled to said output current valve and formed with drain-to-source-coupled third and fourth valve transistors and said controller is configured to establish a replica current through said replica current valve.

5. The network of claim 4, further including first and second current transistors that respectively conduct first and second currents and are respectively gate-coupled to said third and fourth valve transistors to thereby establish said replica current.

6. The network of claim 5, wherein said first and second current transistors are diode coupled.

7. The network of claim 5, wherein said controller further includes:

a first differential amplifier arranged to drive the gate of said first current transistor to reduce a voltage difference between the drain of said first current transistor and one side of said replica current valve; and a second differential amplifier arranged to drive the gate of said second current transistor to reduce a voltage difference between the drain of said second current transistor and another side of said replica current valve.

8. The network of claim 5, further including first and second current sources that provide said first and second currents.

9. The network of claim 5, wherein the transistors of said output and replica current valves and said first and second current transistors carry substantially the same current density.

10. The network of claim 9, wherein:

said first and second current transistors and the transistors of said replica current valve have a first gate width; and the transistors of said output current valve have a second gate width that exceeds said first gate width.

11. The network of claim 4, wherein said controller further includes:

a complimentary common-drain replica stage formed with top and bottom replica transistors wherein said replica current valve is inserted between said replica transistors;

a first differential amplifier arranged to drive the gates of one of said output transistors and one of said replica transistors to establish top and bottom replica voltages about said replica current valve; and a second differential amplifier arranged to drive the gates of the other of said output transistors and the other of said replica transistors to establish a common-mode level of said top and bottom replica voltages.

12. A reference network to provide reference voltages, comprising:

a complimentary common-drain output stage formed with top and bottom output transistors;

an output current valve of first and second valve transistors inserted between said output transistors; and a controller that provides gate voltages to said first and second valve transistors to establish a substantially-constant output current through said output current valve and provides gate voltages to said top and bottom output transistors to establish top and bottom reference voltages about said output current valve that are spaced from a common-mode voltage;

wherein said first and second valve transistors are arranged in a drain-coupled configuration and further including a common-mode amplifier positioned to drive the coupled sources.

13. The network of claim 12, wherein said controller is configured to:

adjust the gate voltage of one of said top and bottom output transistors to selectively space apart said top and bottom reference voltages; and adjust the gate voltage of the other of said top and bottom output transistors to center said top and bottom reference voltages on said common-mode voltage.

14. The network of claim 12, wherein said controller includes a replica current valve gate-coupled to said output current valve and formed with source-coupled third and fourth valve transistors and said controller is configured to establish a replica current through said replica current valve.

15. The network of claim 14, further including first and second current transistors that respectively conduct first and second currents and are respectively gate-coupled to said third and fourth valve transistors to thereby establish said replica current.

16. A signal converter system that provides a digital code which corresponds to an analog input signal, comprising:

a pipelined arrangement of converter stages configured to provide said digital code in response to said analog input signal wherein at least one of said stages includes a multiplying digital-to-analog converter that responds to reference signals; and a reference network that includes:

a complimentary common-drain output stage formed with top and bottom output transistors;

an output current valve of first and second valve transistors inserted between said output transistors; and a controller that provides gate voltages to said first and second valve transistors to establish a substantially-constant output current through said output current valve and provides gate voltages to said top and bottom output transistors to establish top and bottom reference voltages about said output current valve that are spaced from a common-mode voltage.

17. The system of claim 16, wherein said first and second valve transistors are arranged in a drain-to-source-coupled configuration.

18. The system of claim 16, wherein said first and second valve transistors are arranged in a drain-coupled configuration and further including a common-mode amplifier positioned to drive the coupled sources.

19. The system of claim 16, wherein said controller is configured to:
   adjust the gate voltage of one of said top and bottom output transistors to selectively space apart said top and bottom reference voltages; and
   adjust the gate voltage of the other of said top and bottom output transistors to center said top and bottom reference voltages on said common-mode voltage.

20. The system of claim 16, wherein said controller includes a replica current valve gate-coupled to said output current valve and formed with drain-to-source-coupled third and fourth valve transistors and said controller is configured to establish a replica current through said replica current valve.

* * * * *